US008917011B2

United States Patent
Hung

(10) Patent No.: US 8,917,011 B2
(45) Date of Patent: Dec. 23, 2014

(54) LED HEAT DISSIPATION STRUCTURE

(71) Applicant: Shunchi Technology Co., Ltd., Taichung (TW)

(72) Inventor: You-Nan Hung, Taichung (TW)

(73) Assignee: Shunchi Technology Co. Ltd., Taichung (TW)

( * ) Notice: Subject to any disclaimer, the term of this patent is extended or adjusted under 35 U.S.C. 154(b) by 0 days.

(21) Appl. No.: 13/855,091

(22) Filed: Apr. 2, 2013

(65) Prior Publication Data

US 2014/0293610 A1   Oct. 2, 2014

(51) Int. Cl.
  *F21V 29/00* (2006.01)
  *F21V 17/00* (2006.01)
  *F21V 17/06* (2006.01)
  *H01L 33/64* (2010.01)

(52) U.S. Cl.
  CPC ............ *F21V 17/005* (2013.01); *F21V 17/06* (2013.01); *F21V 29/004* (2013.01); *H01L 33/642* (2013.01)
  USPC ......... 313/46; 362/249.02; 362/294; 362/373

(58) Field of Classification Search
  CPC ...... F21S 48/335; F21V 17/005; F21V 17/06; F21V 17/08; F21V 19/003; F21V 19/0035; F21V 19/005; F21V 19/0055; F21V 29/004; F21V 29/2256; F21V 29/2268; H01L 33/64; H01L 33/642; H01L 33/648

USPC .................. 313/46; 362/249.02, 294, 373
See application file for complete search history.

(56) References Cited

U.S. PATENT DOCUMENTS

2007/0253202 A1*  11/2007  Wu et al. ................... 362/294
2009/0262542 A1*  10/2009  Li et al. ..................... 362/373
2010/0294465 A1*  11/2010  Chen et al. ............. 165/104.26
2013/0121759 A1*   5/2013  Breidenassel et al. ...... 403/330

FOREIGN PATENT DOCUMENTS

WO    WO2012007413 A1 *  1/2012

* cited by examiner

*Primary Examiner* — Nimeshkumar Patel
*Assistant Examiner* — Steven Horikoshi
(74) *Attorney, Agent, or Firm* — Rosenberg, Klein & Lee

(57) ABSTRACT

An LED heat dissipation structure including: a heat sink, with a lug axially extended from an end of the heat sink, a hollow portion disposed inside the heat sink and axially extended to the lug, and a plurality of fins integrally extended from a peripheral side of the heat sink; and a support base, having an axial through hole sheathed on the lug of the heat sink, and an end of the support base abutting the support surface of the heat sink. A semiconductor light emitting module is tightly coupled onto a distal surface at an end of the lug for conducting generated heat to the heat sink, and a mirror mount is pressed against the semiconductor light emitting module and coupled to the support base.

6 Claims, 5 Drawing Sheets

LED HEAT DISSIPATION STRUCTURE

FIELD OF THE INVENTION

The present invention relates to a light emitting diode (LED) lamp, and more particularly to the LED lamp with an integral heat dissipation structure.

BACKGROUND OF THE INVENTION

With reference to FIG. 5 for a conventional LED lamp of a light engine device, the LED lamp has a fin structure comprised of two parts 7, wherein a combining surface 71 of the two parts has a first containing slot 72 and a second containing slot 73 integrally and separately formed on both sides of the first containing slot 72, so that there are three through holes provided for containing a heat pipe 81 and electric wires 82 of a semiconductor light emitting module 8. The conventional LED lamp achieves the heat dissipation effect by conducting heat generated by the semiconductor light emitting module 8 through the heat pipe 81 and then dissipated to the outside from a plurality of fins 74.

In the foregoing heat dissipation structure, the heat pipe 81 must be in a tight contact with the first containing slots 72 of the two parts to achieve a good thermal conduction effect. If the tightness of the combining surface 71 of the two parts 7 is not up to a standard, the thermal conduction effect will be low, and the lamp may be overheated or even damaged. On the other hand, the through holes of the second containing slot 73 are provided for containing the electric wires 82, but the electric wires 82 are soft and easy to deform, so that it takes much more time to install the deformed electric wires 82 into the through holes during the installation process, thus incurring a higher assembling cost. If the electric wires 82 are not installed into the through holes properly but they are clamped at the combining surface 71 of the two parts 7, the heat pipe 81 will be unable to conduct heat to the fins 74. Obviously, the conventional heat dissipation structure requires improvements.

In view of the aforementioned problems, the inventor of the present invention based on years of experience in the related industry to conduct extensive researches and experiments, and finally developed an LED heat dissipation structure in accordance with the present invention to overcome the problems of the prior art.

SUMMARY OF THE INVENTION

Therefore, it is a primary objective of the present invention to overcome the aforementioned problems by providing an LED heat dissipation structure with an integrally formed fin structure, so that heat generated by a lamp can be conducted to the outside through the material of this structure, and the heat dissipation effect will not be affected by insufficient precision of mold manufacture and assembling.

Another objective of the present invention is to achieve the effects of simplifying the structure of the lamp, saving the assembling time, and reducing the level of difficulty of the manufacture to lower the production cost by using the integrally formed fin structure.

To achieve the aforementioned objectives, the present invention provides an LED heat dissipation structure, comprising a heat sink, with a lug axially extended from an end of the heat sink, a hollow portion disposed inside the heat sink and axially extended to the lug, and a plurality of fins integrally extended from a peripheral side of the heat sink; and a support base, having an axial through hole sheathed on the lug of the heat sink, and an end of the support base abutting the support surface of the heat sink, wherein a semiconductor light emitting module is tightly coupled to a distal surface at an end of the lug for conducting generated heat to the heat sink, and a mirror mount is pressed against the semiconductor light emitting module and coupled to the support base.

The technical characteristics, contents, advantages and effects of the present invention will be apparent with the detailed description of a preferred embodiment accompanied with the illustration of related drawings as follows.

DESCRIPTION OF THE PREFERRED EMBODIMENTS

Figure 1:
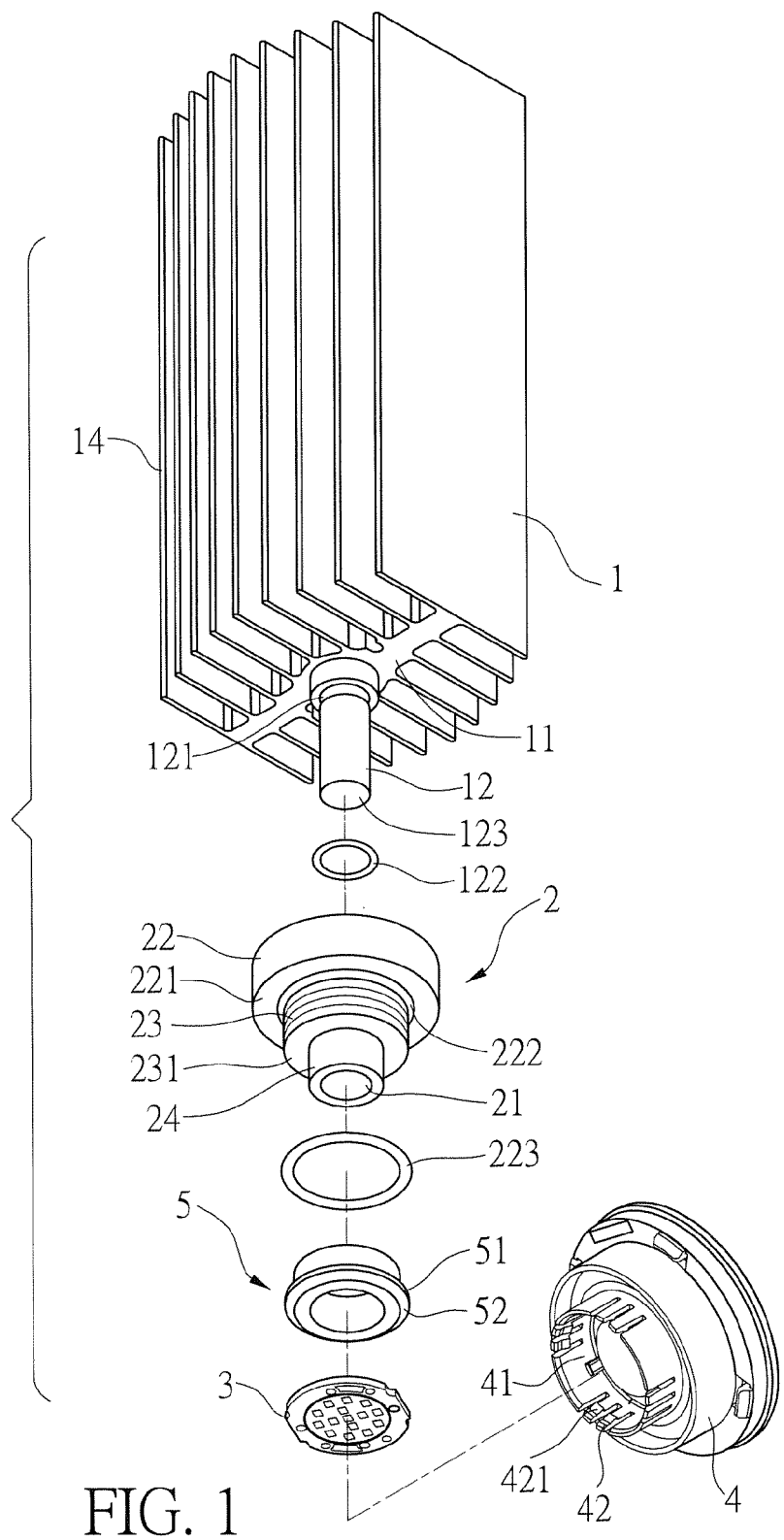
FIG. 1 is an exploded view of the present invention.
Figure 2:
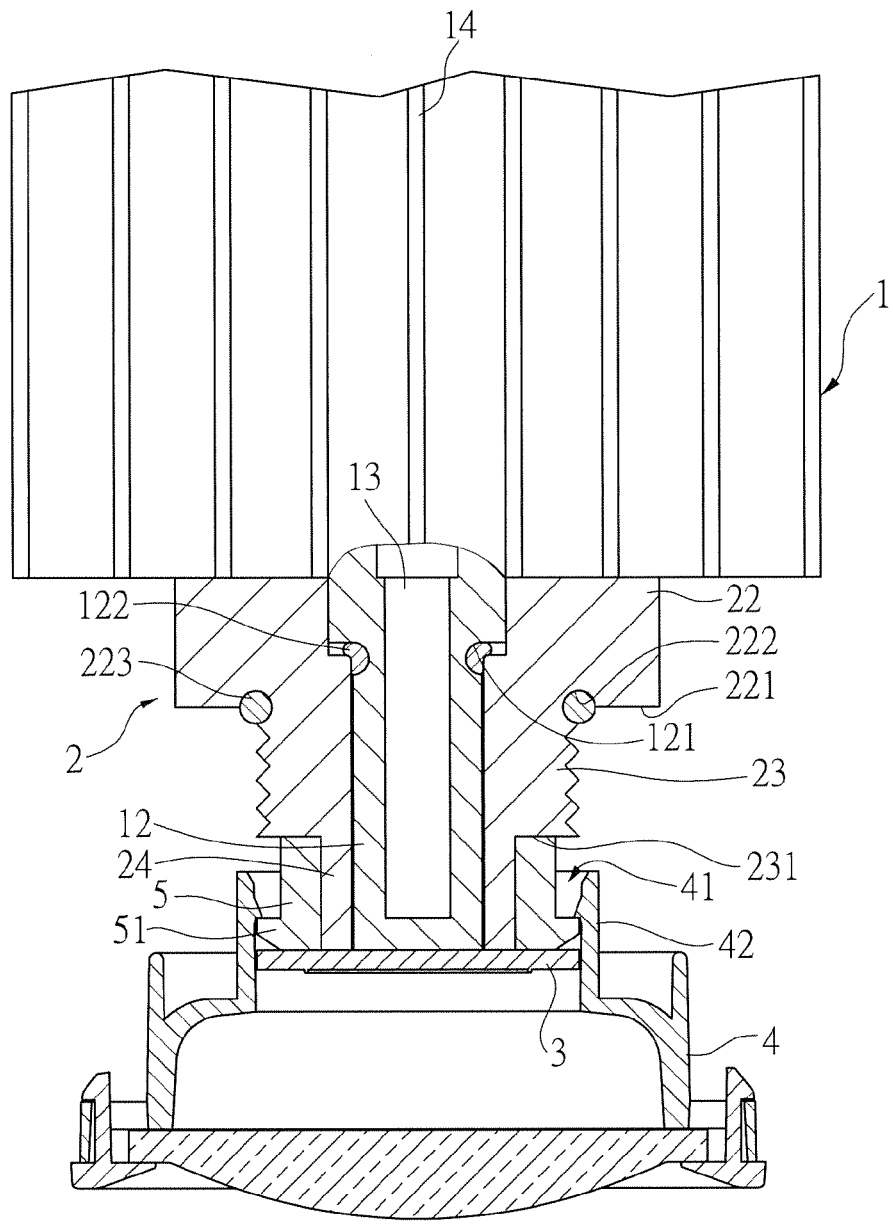
FIG. 2 is a cross-sectional view of the present invention.

With reference to FIGS. 1 and 2 for an LED heat dissipation structure of the present invention, the LED heat dissipation structure comprises a heat sink 1 integrally formed in a column shape and having a support surface 11 disposed at an end of the heat sink 1, and a lug 12 axially extended from the support surface 11. The heat sink 1 has a hollow portion 13 disposed therein and axially extended to the lug 12, and a plurality of fins 14 integrally extended from the peripheral side of the heat sink 1, wherein the hollow portion 13 contains a heat dissipating liquid, so that after the liquid absorbs heat, the liquid in the hollow portion 13 is evaporated into a gas. The gas rises due to density, and the heat is dissipated by the heat sink 1 and the fins 14 while the gas is rising, so that the gas can return to its liquid form and drops to the bottom, so as to define a cycle of a heat dissipation process, and the LED heat dissipation structure is called a "light engine device".

The lug 12 includes a support base 2 disposed outside the lug 2 and having an axial through hole 21 sheathed on the lug 12 of the heat sink 1 and fixed to the lug 12, a first ring groove 121 formed around an external wall of the lug 12, and a first seal ring 122 installed into the first ring groove 121 for a waterproof purpose. An end of the support base 2 abuts the support surface 11 of the heat sink 1, wherein the lug 12 has a length not smaller than the through hole 21 of the support base 2, such that a distal surface 123 at an end of the lug 12 is aligned evenly with the through hole 21 of the support base 2. A semiconductor light emitting module 3 is installed on and abutted against the distal surface 123 of the lug 12, wherein a cooling medium layer (not shown in the figure) is disposed between the semiconductor light emitting module 3 and the distal surface 123 of the lug 12 in this preferred embodiment and the cooling medium layer is made of a heat dissipation material with a high thermal conductivity for improving the thermal conductivity of the semiconductor light emitting module 3.

In addition, a minor mount 4 is pressed at the semiconductor light emitting module 3 and combined with the support base 2 to form the LED lamp of the present invention. More specifically, the support base 2 includes three layers disposed axially downward and having a tapered stair shape, and the three layers include a first stair 22, a second stair 23 and a third stair 24, wherein a first stair surface 221 and a second stair surface 231 are formed at connections of any two adjacent stairs. For the connection of the mirror mount 4 and the support base 2, a light cup holder 5 is installed outside the third stair 24 of the support base 2, wherein the light cup holder 5 is in a circular cylindrical shape and coupled to the exterior of the third stair 24 of the support base 2 by a gluing or screwing method and abutted at the second stair surface 231, and a snap portion 51 is expanded towards an external wall of the light cup holder 5 in a radial direction, and a bottom surface 52 of the snap portion 51 is an oblique surface. In addition, the mirror mount 4 has a snap slot 41 for snapping the snap portion 51, wherein the snap slot 41 has a backstop hook portion 42 disposed on an internal wall of the snap slot 41, and a top surface 421 of the backstop hook portion 42 is also an oblique surface, such that the snap portion 51 of the light cup holder 5 can be extended into the snap slot 41 of the mirror mount 4 and snapped into the backstop hook portion 42 to combine the mirror mount 4 onto the support base 2.

Figure 3:
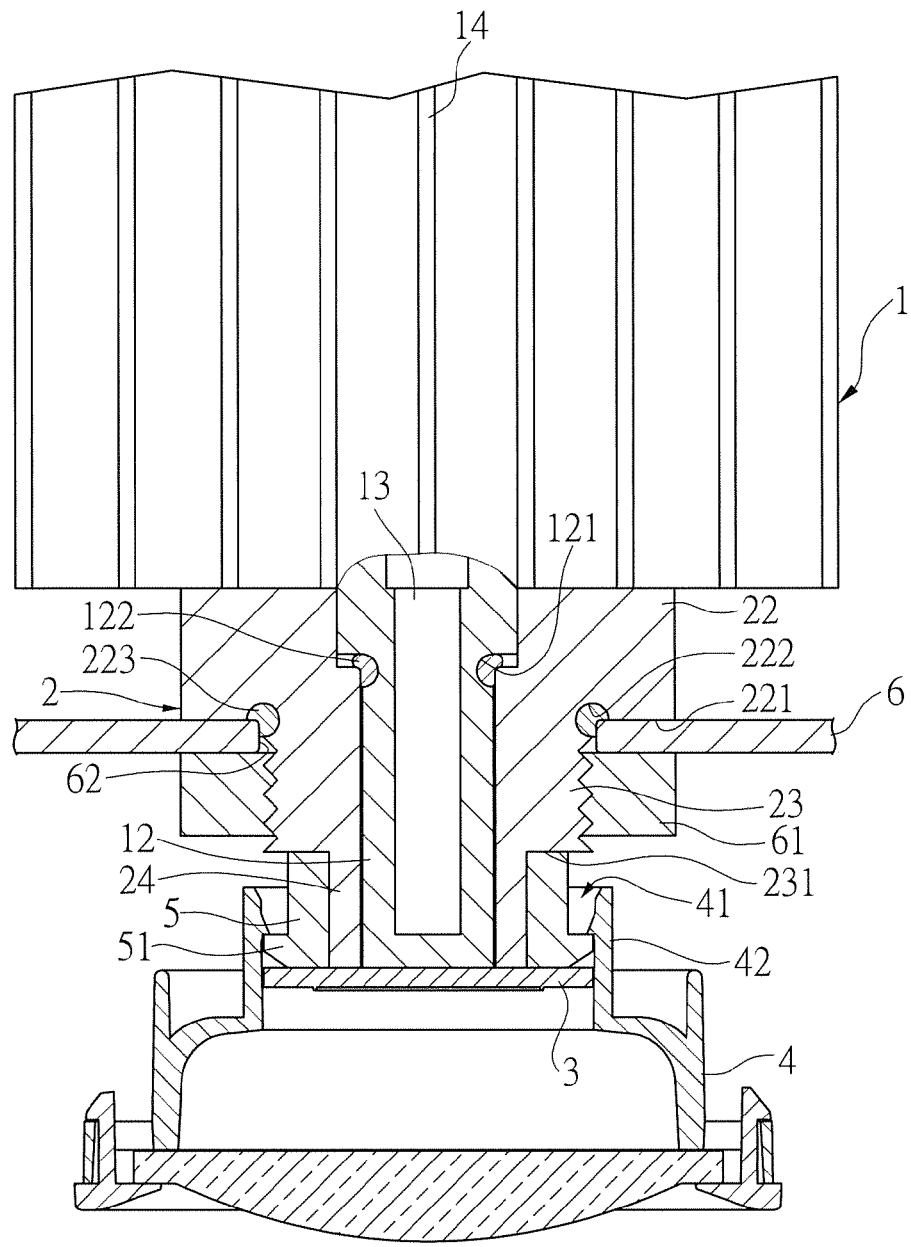
FIG. 3 is a schematic view of an LED heat dissipation structure fixed to an intermediate plate in accordance with the present invention.
Figure 4:
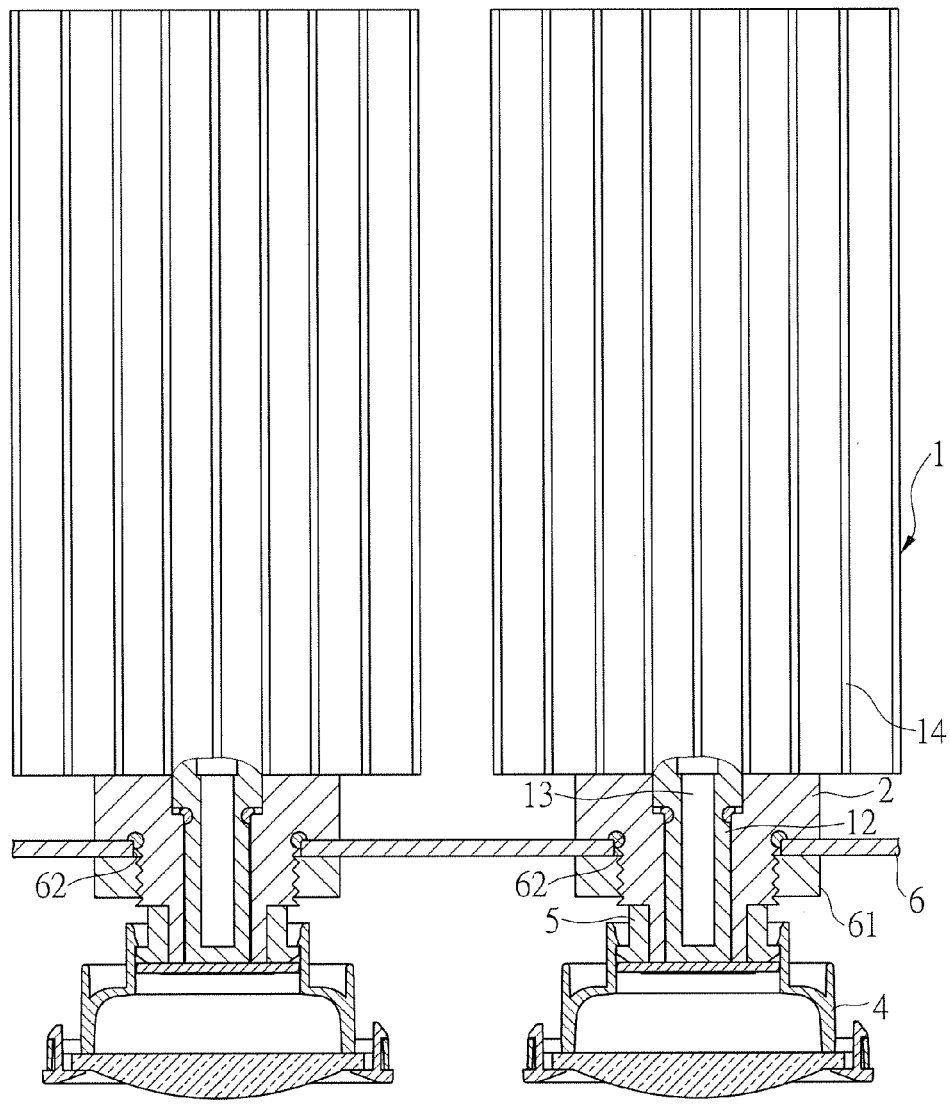
FIG. 4 is a schematic view of a plurality of LED heat dissipation structures combined with an intermediate plate in accordance with the present invention.
Figure 5:
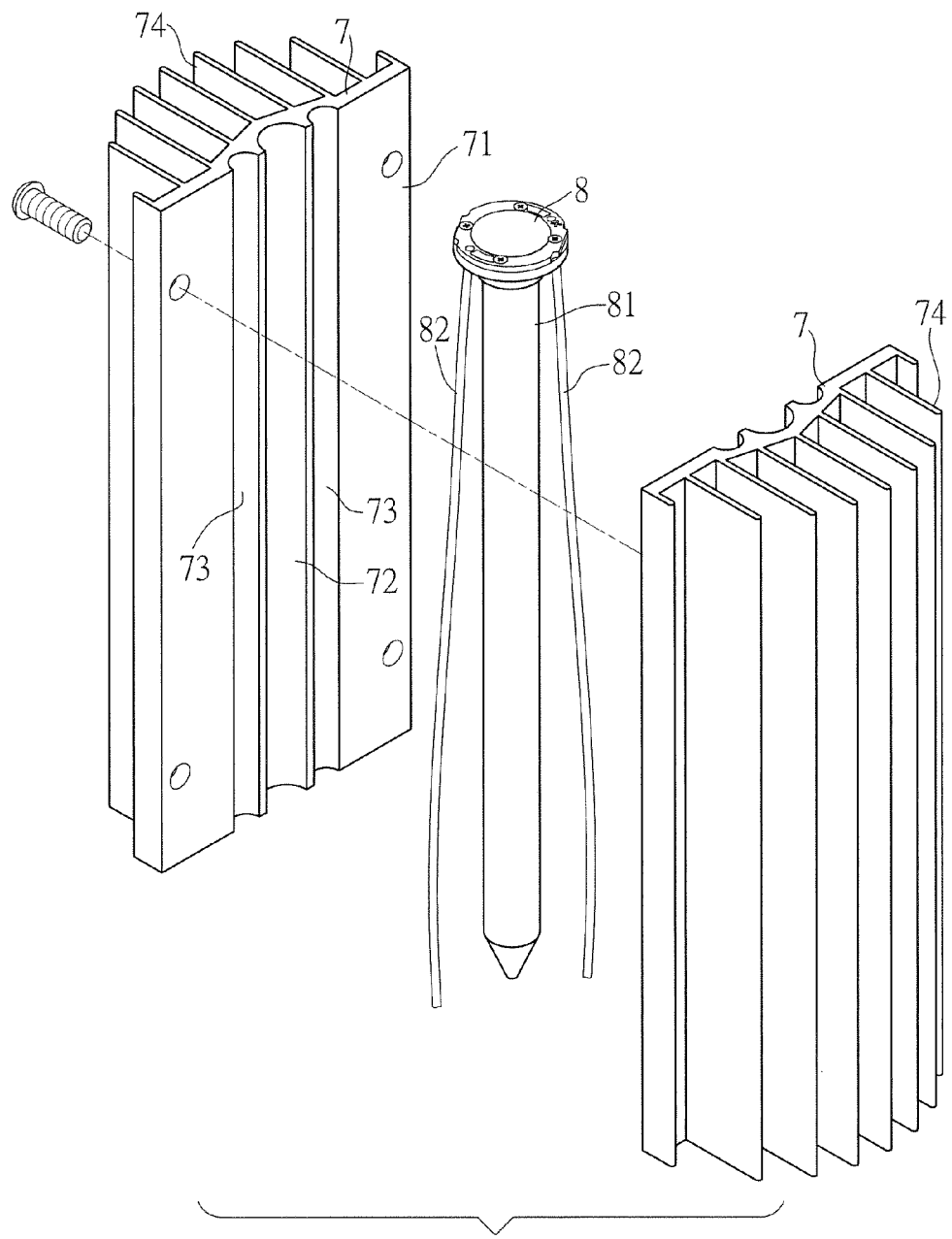
FIG. 5 is an exploded view of a conventional heat dissipation structure.

In the present invention as shown in FIG. 3, the LED heat dissipation structure can be combined with an intermediate plate 6. In FIG. 4, the intermediate plate 6 has a plurality of installation holes 62 formed thereon for installing the components of the present invention therein. In FIG. 3, the support base 2 of the present invention is passed through the installation hole 62 of the intermediate plate 6, and the first stair surface 221 is abutted at the intermediate plate 6, and the other side of the intermediate plate 6 is secured onto the second stair 23 of the support base 2 by a nut 61, so as to force the intermediate plate 6 to press onto the first stair surface 221, and fix each unit of the present invention onto the intermediate plate 6. The aforementioned method can be used for a large-area layout. In addition, a second ring groove 222 is concavely formed on the first stair surface 221 of the support base 2 and provided for installing a second seal ring 223 therein, and the intermediate plate 6 is pressed into the second ring groove 222 to seal the gap to achieve a waterproof effect.

In summation of the description above, the present invention has the following advantages. The heat sink of the light engine device is integrally formed with the fins to achieve a good thermal conduction effect, and the simple components and their combination method can achieve the effects of assembling the LED heat dissipation structure in a simple, easy and quick manner, reducing the manufacturing time and the level of difficulty of the manufacture, and lowering the cost.

While the invention has been described by means of specific embodiments, numerous modifications and variations could be made thereto by those skilled in the art without departing from the scope and spirit of the invention set forth in the claims.

What is claimed is:

1. An LED heat dissipation structure, comprising:
a heat sink, integrally formed, and having a support surface disposed at an end of the heat sink, a lug axially extended from the support surface, a hollow portion disposed inside the heat sink and axially extended to the lug, and a plurality of fins integrally extended from a peripheral side of the heat sink;
a support base, having an axial through hole sheathed on the lug of the heat sink, and an end of the support base abutting the support surface of the heat sink, wherein the lug has a length not smaller than the through hole of the support base, and a semiconductor light emitting module is tightly coupled onto a distal surface at an end of the lug, and a mirror mount is pressed against the semiconductor light emitting module and coupled to the support base;
wherein the support base can be fixed onto an intermediate plate having a plurality of installation holes; and
the support base is in a stair shape in an axial direction and has a stair surface, and the support base is passed through the installation hole of the intermediate plate, and the stair surface of the support base is abutted against the intermediate plate, and the other side of the intermediate plate is secured onto the support base by a nut to force the intermediate plate to press onto the stair surface tightly.

2. The LED heat dissipation structure of claim 1, wherein the lug has a first ring groove formed around an external wall of the lug, and a first seal ring installed into the first ring groove.

3. The LED heat dissipation structure of claim 1, further comprising a cooling medium layer disposed between the semiconductor light emitting module and the distal end at the end of the lug.

4. The LED heat dissipation structure of claim 1, wherein the support base has a light cup holder, and a snap portion is radially extended towards an external wall of the light cup holder, and the mirror mount has a snap slot for snapping in the snap portion, and a backstop hook portion is disposed around an internal wall of the snap slot for extending the light cup holder and the snap portion into the snap slot of the mirror mount and snapping into the backstop hook portion to combine the mirror mount with the support base.

5. The LED heat dissipation structure of claim 4, wherein the light cup holder is coupled to the support base by a gluing or screwing method.

6. The LED heat dissipation structure of claim 1, wherein the stair surface of the support base has a second ring groove concavely formed thereon, and a second seal ring installed into the second ring groove.

* * * * *